United States Patent
Gong

(10) Patent No.: US 11,978,505 B2
(45) Date of Patent: May 7, 2024

(54) DRIVE CIRCUIT WITH ADJUSTABLE PULL-UP RESISTOR, AND MEMORY COMPRISING THE SAME

(71) Applicant: CHANGXIN MEMORY TECHNOLOGIES, INC., Hefei (CN)

(72) Inventor: Yuanyuan Gong, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 189 days.

(21) Appl. No.: 17/498,794

(22) Filed: Oct. 12, 2021

(65) Prior Publication Data

US 2022/0223198 A1 Jul. 14, 2022

Related U.S. Application Data

(63) Continuation of application No. PCT/CN2021/104987, filed on Jul. 7, 2021.

(30) Foreign Application Priority Data

Jan. 11, 2021 (CN) .......................... 202110032626.0

(51) Int. Cl.
  *G11C 11/4096* (2006.01)
  *G11C 7/10* (2006.01)
  *G11C 11/4093* (2006.01)

(52) U.S. Cl.
  CPC ........ *G11C 11/4096* (2013.01); *G11C 7/1057* (2013.01); *G11C 11/4093* (2013.01); *G11C 2207/2254* (2013.01)

(58) Field of Classification Search
  None
  See application file for complete search history.

(56) References Cited

U.S. PATENT DOCUMENTS

| | | |
|---|---|---|
| 7,853,842 B2 | 12/2010 | Kim |
| 7,969,182 B2 | 6/2011 | Kim |
| 10,720,191 B2 | 7/2020 | Seong |
| 10,748,585 B2 | 8/2020 | Choi |
| 11,196,418 B1* | 12/2021 | Suryanarayana .... G11C 29/028 |
| 2003/0218477 A1* | 11/2003 | Jang .................... H04L 25/0298 326/30 |
| 2008/0304336 A1 | 12/2008 | Kim |

(Continued)

FOREIGN PATENT DOCUMENTS

| | | |
|---|---|---|
| CN | 107393576 A | 11/2017 |
| CN | 108511013 A | 9/2018 |

(Continued)

*Primary Examiner* — J. H. Hur
(74) *Attorney, Agent, or Firm* — Cooper Legal Group, LLC

(57) ABSTRACT

Provided is a drive circuit, including drive units, a pre-drive module, and a resistance value selection circuit. Pull-up resistors of the drive units are adjustable; the pre-drive module is connected to M drive units and controls the pull-up resistors of the M drive units and resistance values of the pull-up resistors through a drive control signal, the M being an integer greater than 1; the resistance value selection circuit is connected to the pre-drive module and configured to select one of a first code and a second code for outputting as a target code according to a selection signal; and the pre-drive module outputs the drive control signal according to the target code.

15 Claims, 7 Drawing Sheets

(56) References Cited

U.S. PATENT DOCUMENTS

| | | | |
|---|---|---|---|
| 2009/0243748 A1* | 10/2009 | Kinoshita | H03K 19/0005 333/17.3 |
| 2011/0025373 A1 | 2/2011 | Kim | |
| 2017/0331476 A1* | 11/2017 | Cho | G11C 29/025 |
| 2019/0198066 A1 | 6/2019 | Seong | |
| 2020/0058332 A1 | 2/2020 | Choi | |
| 2022/0083244 A1* | 3/2022 | Um | G11C 7/1051 |

FOREIGN PATENT DOCUMENTS

| | | |
|---|---|---|
| CN | 110047526 A | 7/2019 |
| CN | 110838336 A | 2/2020 |
| CN | 210606642 U | 5/2020 |

\* cited by examiner

DRIVE CIRCUIT WITH ADJUSTABLE PULL-UP RESISTOR, AND MEMORY COMPRISING THE SAME

CROSS-REFERENCE TO RELATED APPLICATIONS

This is a continuation of International Patent Application No. PCT/CN2021/104987, filed on Jul. 7, 2021, which claims priority to Chinese Patent Application No. 202110032626.0, filed on Jan. 11, 2021. The disclosures of International Patent Application No. PCT/CN2021/104987 and Chinese Patent Application No. 202110032626.0 are incorporated herein by reference in their entireties.

TECHNICAL FIELD

The present application relates to, but is not limited to, a drive circuit and a memory comprising the drive circuit.

BACKGROUND

During the use of a Dynamic Random Access Memory (DRAM), the speed, integrality, and accuracy of data reading and writing are always important indexes for evaluation of DRAM performances. However, a relatively important factor used for deciding the speed, integrality, and accuracy of data reading and writing of DRAM is the resistance value of the drive circuit in a DRAM chip. The drive circuit in the DRAM chip is electrically connected to and performs signal interaction with a DRAM Controller chip, an output impedance of the drive circuit may influence the speed, integrality, and accuracy of the signal for the data from the DRAM chip to the DRAM Controller chip, and a terminal resistor of the drive circuit may influence the speed, integrality, and accuracy of a signal transmitted from the DRAM Controller chip to the DRAM chip.

SUMMARY

Embodiments of the present application provide a drive circuit, including:
drive units, having pull-up resistors adjustable;
a pre-drive module, connected to M drive units and configured to control the pull-up resistors of the M drive units and resistance values of the pull-up resistors through a drive control signal, the M being an integer greater than 1; and
a resistance value selection circuit, connected to the pre-drive module and configured to select, according to a selection signal, one of a first code and a second code for outputting as a target code, the pre-drive module outputting the drive control signal according to the target code.

Embodiments of the present application provide a memory, which includes the drive circuit as described above, and a control circuit. The drive circuit selects to receive a pre-output signal inside the memory as its own input signal according to a read enable signal from the control circuit, or the drive circuit selects to receive a pre-input signal outside the memory as its own input signal according to a write enable signal from the control circuit.

REFERENCE NUMERALS

Figure 1:
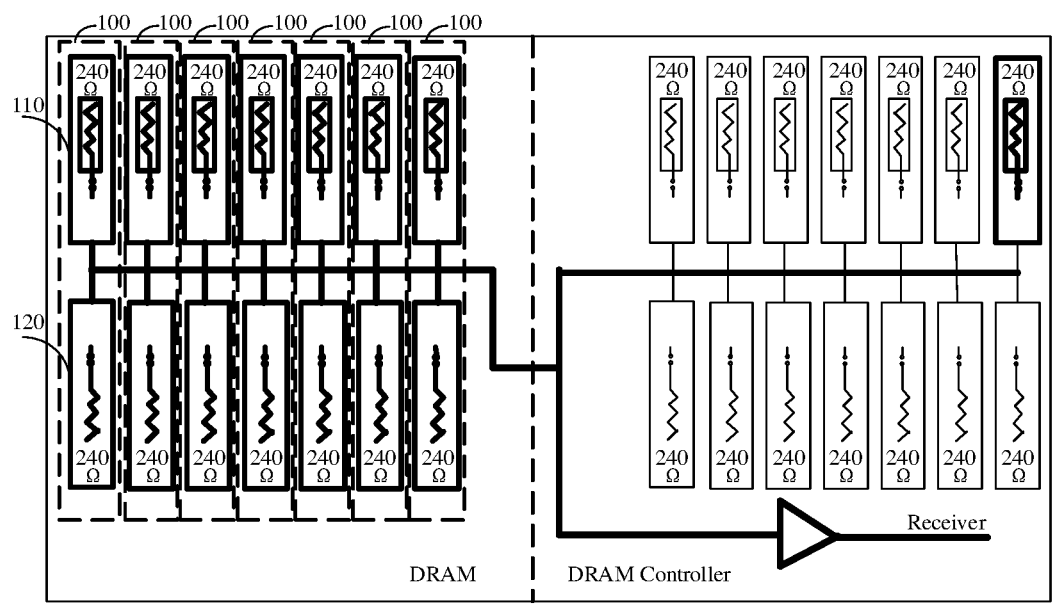
FIG. 1 is a schematic diagram of data reading of DRAM provided by the present application.

Drive circuit 10
Drive unit 100
First pull-up transistor 110
First transistor 111
First pull-down transistor 120
Second transistor 121
Pre-drive module 200
Resistance value selection circuit 300
Calibration circuit 310
Comparator 311
Counter 312
Pull-up module 313
External calibration resistor 314
Power terminal 20
Input/output terminal 30
Ground terminal 40
Calibration port 50
Power terminal 51
Memory 70
Control circuit 71

DETAILED DESCRIPTION

Exemplary embodiments would be explained in detail herein, and are exemplarily represented in the accompanying drawings. When the descriptions below relate to the drawings, unless otherwise indicated, the same number in different accompanying drawings represents same or similar elements. Implementations described in the exemplary embodiments below do not represent all implementations consistent with this disclosure. On the contrary, they are only examples of apparatuses and methods consistent with some aspects of the present disclosure that are detailed in the accompanying claims.

As the increasing of the reading and writing speed of the DRAM, for example, the reading and writing speed of DDR4 may reach 3.2 GHz; the reading and writing speed of DD5 may even reach 6.4 GHz; this requires the requirements of impedance matching to be met when a DRAM controller chip exchanges data with DRAM chips. If the impedance matching is not met, signals transmitted during data exchange would be reflected, which severely influences the quality of the transmission signal, rendering that the DRAM controller chip cannot distinguishing the high level or low level of the signals transmitted by the DRAM chip when a read operation is performed on the DRAM chip, and the DRAM chip cannot distinguishing the high level or low level of the signal transmitted by the DRAM controller chip when a write operation is performed on the DRAM chip. In the use standard of the DRAM chip, the requirements of impedance matching are specified. For example, when a write operation is performed on the DRAM chip, the receiving circuit in the DRAM chip is used as a signal receiver, pull-up resistors of the drive circuit in the DRAM chip are used as the terminal resistor Rtt; the DRAM controller chip is used as a transmitter of the signal and has an output impedance Ron. Assuming the output impedance Ron of the transmitter is 34 Ohms, the terminal resistor Rtt requires 240 Ohms or a certain percentage deviation is allowed; for example, if the terminal resistor Rtt allows a deviation of 10%, then the terminal resistor Rtt may be 216-264 Ohms. For another example, when a read operation is performed on the DRAM chip, the drive circuit in the DRAM chip is used as the transmitter of the signal, the pull-up resistors of the drive circuit in the DRAM chip are used as the output impedance Ron, and the DRAM controller chip is used as the receiver of the signal and has the terminal resistor Rtt. Assuming the terminal resistor Rtt is 240 Ohms, the output impedance requires to be 34 Ohms, or a certain percentage deviation is allowed, For example, the output impedance Ron allows a deviation of 10%, and thus the output impedance Ron may be 31-37 Ohms. The aforementioned contents are only exemplary, and the specific impedance matching requirements may refer to the standards issued by the Joint Electron Device Engineering Council (JEDEC).

It should be noted that at the side of the DRAM chip, when the write operation is performed on the DRAM chip, the pull-up resistors of the drive circuit of the DRAM chip are used as a terminal resistor Rtt; and when the read operation is performed on the DRAM chip, the pull-up resistors of the drive circuit of the DRAM chip are used as an output impedance Ron. In addition, when the pull-up resistors of the drive circuit are used as the terminal resistor Rtt, if the value of the terminal resistor Rtt is larger in a specified range, it is better for improving the quality and integrality of signal transmission. For example, the terminal resistor Rtt being 264 Ohms is better for improving the quality and integrality of signal transmission than being 240 Ohm. When the pull-up resistors of the drive circuit are used as the output impedance Ron, if the value of the output impedance Ron is less in the specified range, it is better for improving the quality and integrality of signal transmission. For example, when the output impedance Ron being 31 Ohms is better for improving the quality and integrality of signal transmission than being 34 Ohm.

For example, FIG. 1 is a schematic diagram of data reading of DRAM. At the side of the DRAM, a plurality of drive units 100 is included, each drive unit 100 including a first pull-up transistor 110 and a first pull-down transistor 120, and a data signal is transmitted from the DRAM to the DRAM Controller. At the side of the DRAM, the pull-up resistors are used as the output impedance Ron; the output impedance Ron consists of seven 240 Ohms pull-up resistors connected in parallel, and the equivalent output impedance Ron equals to 34 Ohms. At the side of the DRAM Controller, the pull-up resistors are used as a terminal resistor Rtt; the terminal resistor Rtt consists of one 240 Ohms pull-up resistor and six infinite Ohms pull-up resistors connected in parallel; and the equivalent terminal resistor Rtt equals to 240 Ohm, where the infinite Ohms means that the resistance caused by disconnection of the switch is infinite. If the output impedance Ron at the side of the DRAM is reduced to 31 Ohms, which still meets the impedance matching requirements in a certain range, while the drive capability at the side of the DRAM is improved, then the quality and integrality of signal transmission can thereby be improved.

Figure 2:
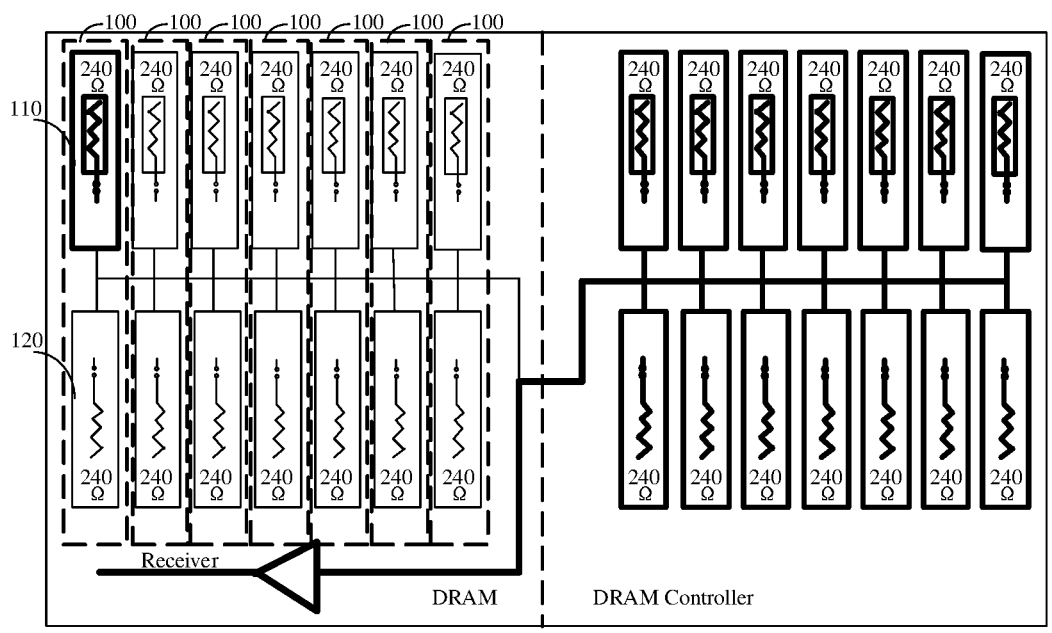
FIG. 2 is a schematic diagram of data writing of DRAM provided by the present application.

For another example, FIG. 2 is a schematic diagram of data writing of DRAM. At the side of the DRAM, a plurality of drive units 100 is included, each drive unit 100 including one first pull-up transistor 110 and one first pull-down transistor 120, and a data signal is transmitted from the DRAM Controller to the DRAM. At the side of the DRAM Controller, the pull-up transistors are used as the output impedance Ron; the output impedance Ron consists of seven 240 Ohms pull-up transistors connected in parallel; and the equivalent output impedance Ron equals to 34 Ohms. At the side of the DRAM, the pull-up resistors are used as the terminal resistor Rtt; the terminal resistor Rtt consists of one 240 Ohms pull-up transistor and six infinite Ohms pull-up transistors connected in parallel; and the equivalent terminal resistor Rtt equals to 240 Ohms, where the infinite Ohm means that the resistance caused by disconnection of the switch is infinite. If the terminal resistor Rtt at the side of the DRAM is increased to 264 Ohms, which still meets the impedance matching requirements in a certain range, while the quality and integrality of signal receiving at the side of the DRAM are improved.

Therefore, the present application provides a drive circuit 10; the drive circuit 10 can adjust its own resistance value according to the read or write state of the DRAM and the resistance value of the DRAM controller, so as to flexibly adjust an impedance matching degree between the DRAM chip and the DRAM controller chip. The DRAM controller may also be referred to as a DRAM controller chip, or a DRAM Controller.

The structure and operating principle of the drive circuit 10 provided by the present application are elaborated in detail below.

Figure 3:
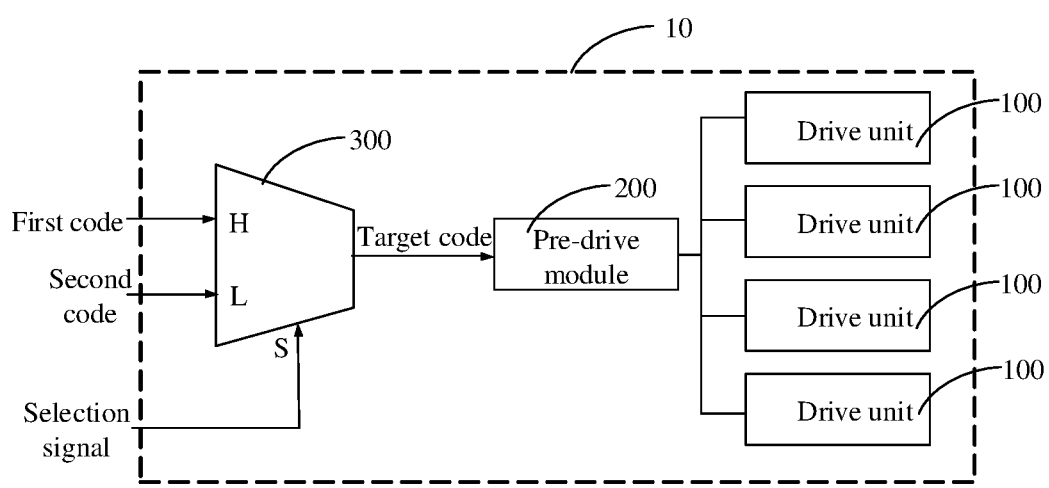
FIG. 3 is a schematic diagram of a drive circuit provided by some embodiments of the present application.

With reference to FIG. 3, the drive circuit 10 provided by the embodiments includes drive units 100, a pre-drive module 200, and a resistance value selection circuit 300.

There are M drive units 100 in total, where M is an integer greater than zero. The pre-drive module 200 is connected to the M drive units, and controls the resistance values of the pull-up resistors in the M drive units 100 through a drive control signal. When the DRAM is in the data writing state, the drive control signal controls the resistance value of a pull-up resistor in each of the M drive units 100. Specifically, to improve the impedance matching degree between the DRAM and the DRAM controller, the drive control signal controls the resistance value of the pull-up resistor in each of the M drive units 100 to be increased, so as to improve the quality and integrality of the signal received by the DRAM. When the DRAM is in the data reading state, the drive control signal controls the resistance value of the pull-up resistor in each of the M drive units 100. Specifically, to improve the impedance matching degree between the DRAM and the DRAM controller, the drive control signal controls the resistance value of the pull-up resistor in each of the M drive units 100 to be decreased, so as to enhance the drive capability of the output signal of the DRAM and improve the integrality of the output signal.

The resistance value selection circuit 300 is connected to the pre-drive module 200; the resistance value selection circuit 300 is configured to receive a selection signal that is externally input, and select, according to the selection signal, one of a first code and a second code for outputting as a target code; and then the pre-drive module 200 outputs the drive control signal according to the target code. In some embodiments, the selection signal is a read flag signal; when the read flag signal is a high level signal, the target code is the first code; and at this time, the DRAM is in a data reading state. When the read flag signal is a low level signal, the target code is the second code; and at this time, the DRAM is in a data writing state. The selection signal is configured to indicate whether the DRAM is in the data reading state or data writing state. The first code is configured to reduce the resistance values of the pull-up resistors in the drive unit 100, or the first code is configured to set the pull-up resistors of the drive unit 100 to have a resistance value less than a first preset resistance value. For example, the first preset resistance value is 34 Ohms, and the first code may set the resistance value of the pull-up resistor in the drive unit 100 as 31 Ohms. The second code is configured to increase the resistance value of the pull-up resistors in the drive unit 100, or the second code is configured to set the pull-up resistors of the drive unit 100 to having a resistance value greater than a second preset resistance value. For example, the second preset resistance value is 240 Ohms, and the second code may set the resistance value of the pull-up resistor of the drive unit 100 as 264 Ohms. In some embodiments, the resistance value selection circuit 300 may be a two-to-one selector.

When the DRAM is in the data reading state, the target code is the first code, i.e., when the resistance value selection circuit 300 outputs the first code, the pre-drive module 200 controls a resistance vale of the pull-resistor of each drive unit 100 to be less than a resistance value of a third resistor according to the first code. When the DRAM is in the data writing state, i.e., when the resistance value selection circuit 300 outputs the second code, the pre-drive module 200 controls a resistance vale of the pull-resistor of each drive unit 100 to be greater than the resistance value of the third resistor according to the second code. The resistance value of the third resistor is a preset resistance value, and the preset resistance value is determined by the value of M. For example, when the DRAM is in the data reading state as shown in FIG. 1, and at this time, M=7 and the preset resistance value of the third resistor is 34 Ohms; then the pre-drive module 200 controls the pull-resistor of each drive unit 100 to be less than 34 Ohms according to the second code; for example, the resistance value of each drive unit 100 in 7 drive units 100 is 31 Ohms. For example, when the DRAM is in the data write state as shown in FIG. 2, and at this time, M=1 and the preset resistance value of the third resistor is 240 Ohms, then the pre-drive module 200 controls the pull-resistor of each drive unit 100 to be greater than 240 Ohms according to the second code; for example, the resistance value of one drive unit 100 is 264 Ohms.

From the above discussion, the drive circuit 10 provided by the embodiments includes drive units 100, the pre-drive module 200, and the resistance value selection circuit 300. The resistance value selection circuit 300 may select, according to the selection signal, the first code or second code as the target code for outputting to the pre-drive module 200. The pre-drive module 200 outputs the drive control signal according to the target code, where the drive control signal controls the resistance values of the pull-up resistors in the M drive units 100. When the DRAM is in the data writing state, the resistance values of the pull-up resistors in the drive unit 100 are increased to be greater than the resistance value of a third resistor under the control of the pre-drive module 200. When the DRAM is in the data reading state, the resistance values of the pull-up resistors in the drive unit 100 is reduced to be less than a resistance value of another third resistor under the control of the pre-drive module 200. Therefore, the drive circuit 10 provided in the embodiments can adjust its own resistance value for the data reading or writing state of the DRAM, so that the impedance matching degree between the DRAM and the controller that controls the data reading and writing by the DRAM is adjustable, thereby improving the speed, integrality, and accuracy of data reading and writing of the DRAM.

Figure 4:
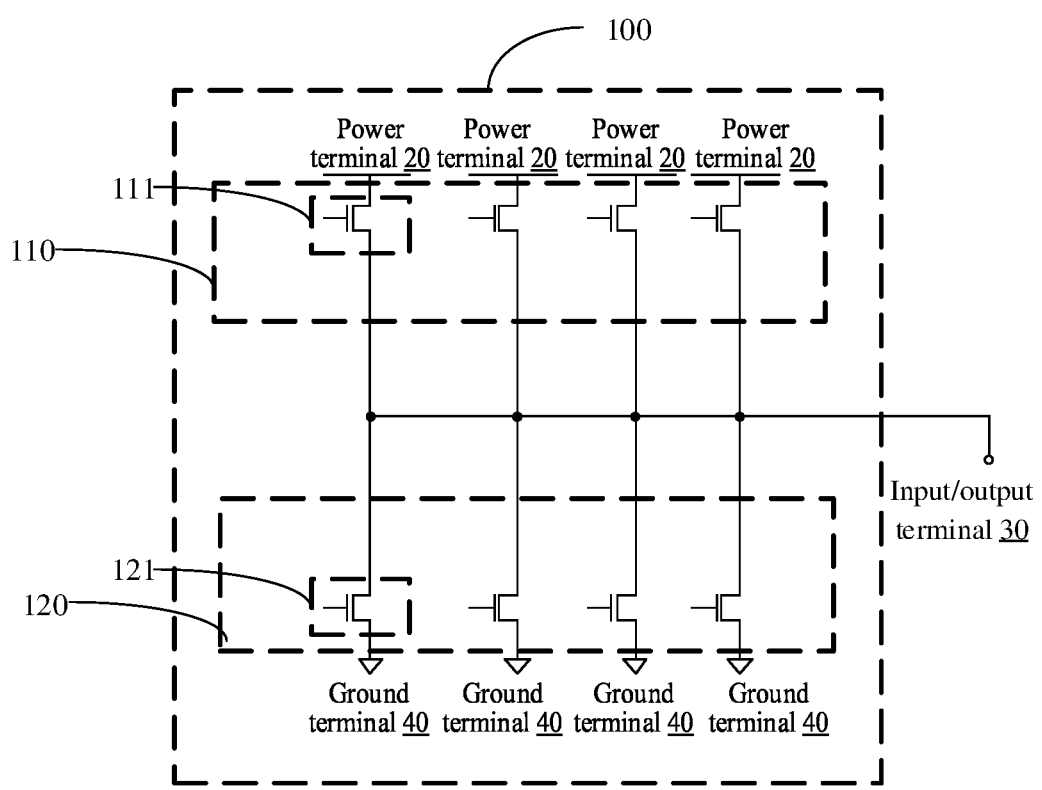
FIG. 4 is a schematic structural diagram of a drive circuit provided by some embodiments of the present application.

With reference to FIG. 4, in some embodiments of the present application, the drive unit 100 includes a first pull-up transistor 110 and a first pull-down transistor 120. That is, one drive unit 100 includes one first pull-up transistor 110 and one first pull-down transistor 120. First ends of the first pull-up transistors 110 of the M drive units 100 are respectively connected to a power terminal 20; and second ends of the first pull-up transistors 110 of the M drive units 100 are respectively connected to an input/output terminal 30. First ends of the first pull-down transistors 120 of the M drive units 100 are all connected to the input/output terminal 30; and second ends of the first pull-down transistors 120 of the M drive units 100 are respectively connected to a ground terminal 40. The input/output terminal 30 is used for inputting or outputting current; the specifications and models of the first pull-up transistor 110 and the first pull-down transistor 120 may be selected according to actual requirements, which are not limited in the present application. The voltage value of the power terminal 20 may be selected according to actual requirements.

The first pull-up transistor 110 may consist of one transistor or a plurality of transistors. In some embodiments, the first pull-up transistor 110 of each drive unit 100 consists of N first transistors 111. First ends of the N first transistors 111 are respectively connected to the power terminal 20; and second ends of the N first transistors 111 are respectively connected to the input/output terminal 30. The first pull-down transistor 120 may consist of one transistor or a plurality of transistors. In some embodiments, the first pull-down transistor 120 of each drive unit 100 consists of N second transistors 121. First ends of the N second transistors 121 are respectively connected to the input/output terminal 30; and second ends of the N second transistors 121 are respectively connected to the ground terminal 40. N is an integer greater than 1; the value of N is determined according to the resistance value of the first transistor 111; the number of the second transistors 121 is determined by the number of the first transistors 111. The specifications and models of the first transistors 111 and the second transistors 121 can both be selected according to actual requirements, which are not limited in the present application. In some embodiments, the first transistor 111 may be a P-type transistor, and the second transistor may be an N-type transistor, or the first transistor 111 and the second transistor 121 are both N-type transistors.

Accordingly, there are M groups of drive control signals; each group has N bits; the M groups of drive control signals have one-to-one correspondence to the M drive units; the N bits of drive control signals have one-to-one correspondence to the N first transistors 111; and each bit of the drive control signals is connected to a control terminal of the corresponding first transistor 111. That is, the drive control signals are first divided into M groups of control signals according to the number of the drive units 100, and then sent to each drive unit 100. The drive control signals received by each drive unit 100 may be the same or different. The divided drive control signals are then further divided according to the number of the first transistors 111 in each group of the drive units 100, to control each first transistor 111, so that each of the first transistors 111 has a separate drive control signal. Whether each first transistor 111 is conducted or not can be controlled, to achieve the purpose of adjusting the resistance value of the drive unit 100.

Figure 5:
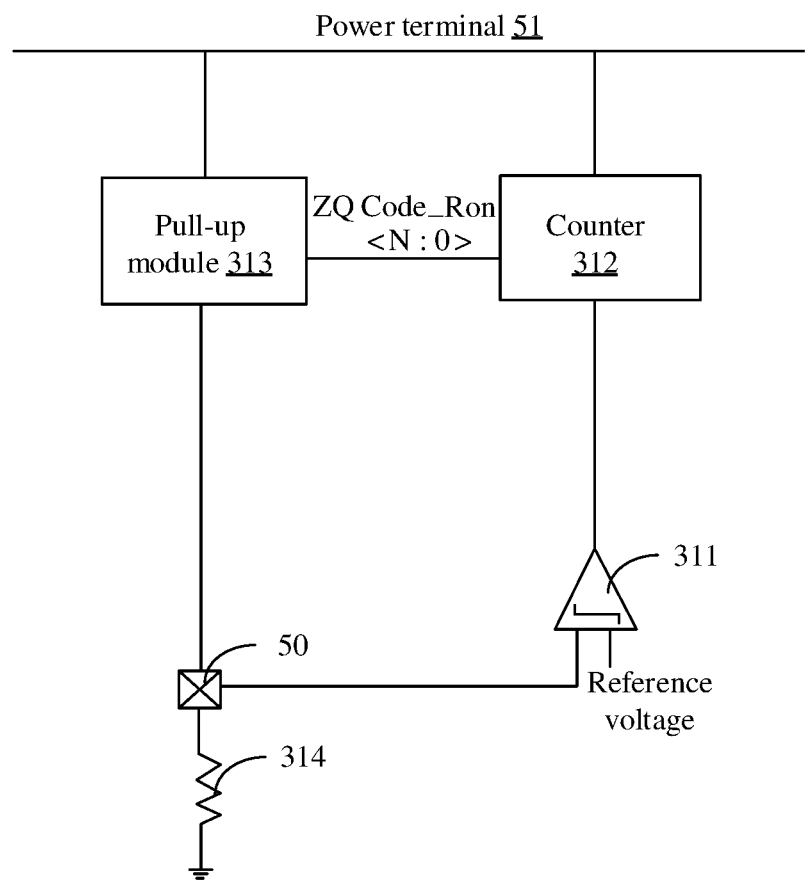
FIG. 5 is a schematic diagram of a calibration circuit provided by some embodiments of the present application.

With reference to FIG. 5, in some embodiments of the present application, the resistance value selection circuit 300 further includes a calibration circuit 310, and the calibration circuit 310 is configured to generate the first code and the second code. The calibration circuit 310 includes a comparator 311, a counter 312, a pull-up module 313, and an external calibration resistor 314.

A first input terminal of the comparator 311 is connected to a reference voltage; the reference voltage is a first reference voltage or a second reference voltage; the first reference voltage is less than the second reference voltage; and a second input terminal of the comparator 311 is connected to a calibration port 50. The counter 312 is connected to an output terminal of the comparator 311; and the counter 312 is configured to determine to output the first code or second code according to the signal output by the comparator 311. Specifically, the first input terminal of the comparator 311 is a positive input terminal of the comparator 311; and the second input terminal of the comparator 311 is a negative input terminal of the comparator 311.

A first end of the pull-up module 313 is connected to a power terminal 51, a second end is connected to the calibration port 50, and a third end is connected to the counter 312; and an equivalent resistance value of the pull-up module 313 from the power terminal 51 to the calibration port 50 is controlled by the first code or second code output by the counter 312. The pull-up module 313 has the same circuit structure as pull-up resistors of the drive units 100. That is, the pull-up module 313 also includes a plurality of transistors. When none of the transistors in the pull-up module 313 is conducted, the equivalent resistance value of the pull-up module 313 is infinite. With the transistors in the pull-up module 313 being conducted, the equivalent resistance value of the pull-up module 313 is gradually reduced. A first end of the external calibration resistor 314 is connected to the calibration port 50, and a second end is connected to a ground terminal. When the equivalent resistance value of the pull-up module 313 is infinite, the voltage of the calibration port is 0, and correspondingly the voltage of the second input terminal of the comparator 311 is 0. When the equivalent resistance value of the pull-up module 313 is gradually reduced, the voltage of the second input terminal of comparator 311 is gradually increased.

Under the condition that the first input terminal of the comparator 311 is connected to the first reference voltage, when the pull-up module 313 does not receive the code input by the counter 312, a logic signal output by the comparator 311 is 1; when receiving the logic signal of 1, the counter 312 outputs the code to the pull-up module 313, so that the transistors in the pull-up module 313 are conducted, thereby improving the voltage of the calibration port. The above process is repeated until the voltage at the calibration port 50 is equal to or greater than the first reference voltage, and at this time, the code output by the counter 312 is the first code. For instance, when all transistors in the pull-up module 313 are not conducted, the code output by the counter 312 for the first time may be ZQ Code_Ron<110>, where ZQ Code_Ron<110> may be used for conducting the first transistor in the pull-up module 313. When the counter 312 receives the output of the comparator 311 for the second time and the logic signal is 1, the code output by the counter 312 for the second time may be ZQ Code_Ron<101>, where ZQ Code_Ron<101> may be used for conducting the third transistor in the pull-up module 313. At this time, assuming that the equivalent resistance value of the pull-up module 313 has already enabled the voltage at the calibration port 50 to be equal to the first reference voltage, the logic signal output from the comparator 311 and received by the counter 312 is 0, and ZQ Code_Ron<101> is the first code. The pull-up module 313 can be understood as a simulation module of the drive unit 100. After receiving the first code, the pre-drive module 200 generates the drive control signal according to the first code. The drive control signal is used to control the resistance value of the pull-up resistor of the drive unit 100 to be equal to the equivalent resistance value of the pull-up module 313 obtained after final adjustment.

When the first input terminal of the comparator 311 is connected to the second reference voltage, the second code generation process is also as stated above. That is, when the pull-up module 313 does not receive the code input by the counter 312, a logic signal output by the comparator 311 is 1; when receiving the logic signal of 1, the counter 312 outputs the code to the pull-up module 313, so that the transistors in the pull-up module 313 are conducted, thereby improving the voltage at the calibration port. The above process is repeated until the voltage at the calibration port 50 is equal to or greater than the first reference voltage, and at this time, the code output by the counter 312 is the second code. For instance, when all transistors in the pull-up module 313 are not conducted, the code output by the counter 312 for the first time may be ZQ Code_Ron<110>. ZQ Code_Ron<110> may be used for conducting the first transistor in the pull-up module 313. When the counter 312 receives the output of the comparator 311 for the second time and the logic signal is 1, the code output by the counter 312 for the second time may be ZQ Code_Ron<100>, where ZQ Code_Ron<100> may be used for conducting the first and second transistors in the pull-up module 313. At this time, assuming that the equivalent resistance value of the pull-up module 313 has already enabled the voltage of the calibration port 50 to be equal to the second reference voltage, the logic signal output from the comparator 311 and received by the counter 312 is 0, and ZQ Code_Ron<100> is the second code. After receiving the second code, the pre-drive module 200 generates the drive control signal according to the second code. The drive control signal is used to control the resistance value of the pull-up resistor of the drive unit 100 to be equal to the equivalent resistance value of the pull-up module 313 obtained after final adjustment.

In some embodiments, the first reference voltage is less than half of a voltage at the power terminal 51; and the second reference voltage is greater than half of the voltage at the power terminal 51. If the voltage at the power terminal 51 is denoted as VDDQ and a resistance value of the external calibration resistor 314 is denoted as RZQ, then the first reference voltage equals to VDDQ*(RZQ−b)/(2*RZQ−b), and the second reference voltage equals to VDDQ*(RZQ+a)/(2*RZQ+a), where a and b are both preset deviation values, and the present deviation values are determined by staffs. In some embodiments, the resistance value of the external calibration resistor 314 may be 240 Ohms, and thus the first reference voltage equals to VDDQ*(240−b)/(480−b), and the second reference voltage equals to VDDQ*(240+a)/(240+a).

Figure 6:
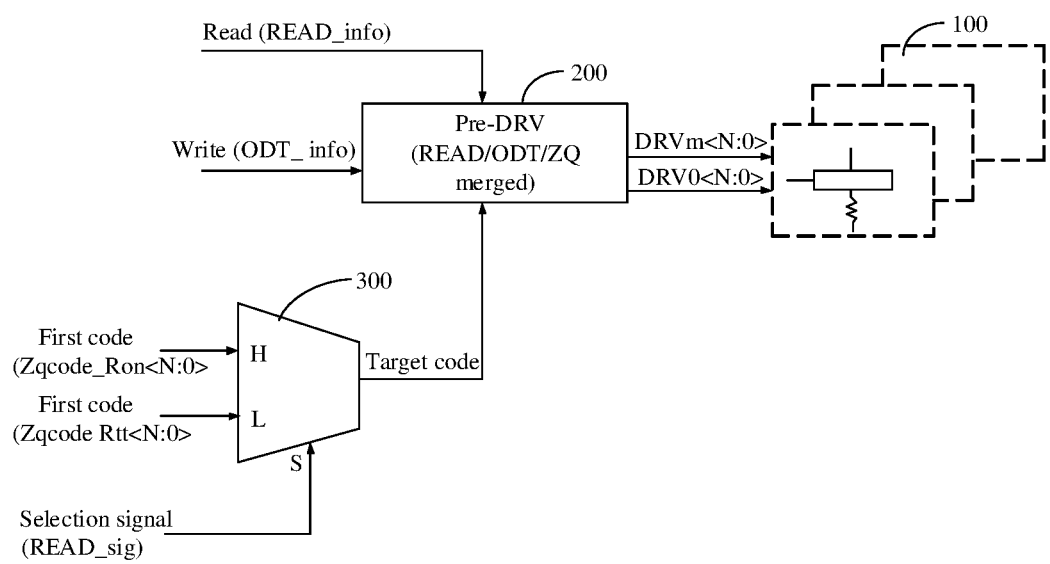
FIG. 6 is a schematic diagram of a drive circuit provided by some embodiments of the present application.

FIG. 6 is the structure and operation principle diagram of the drive circuit 10 provided by the present application. Inside the DRAM, a plurality of 240 Ohms resistors is connected in parallel to constitute a plurality of drive units DRV 100; specifically how many 240 Ohms resistors are used in parallel is controlled by DRV0<N:0> . . . DRVm<N:0> generated by an ODT control signal ODT_info and a read control signal READ_info that pass through the pre-drive module Pre-DRV200. m in DRVm<N:0> determines that there are m 240 Ohms resistors connected in parallel, i.e., m drive units DRV 100 are connected in parallel. <N:0> in DRVm<N:0> is a target code generated by the ZQ calibration technique; and the target code is used for enabling the pre-drive module Pre-DRV200 to adjust an effective resistance value of each 240 Ohms resistor according to the target code. As shown in FIG. 6, the resistance value selection circuit receives a selection signal READ_sig, a first code Zqcode_Ron<N:0>, and a second code Zqcode Rtt<N:0>.

The selection signal READ_sig is a read flag signal. When the DRAM is in a data reading state, i.e., the pull-up resistors at the side of the DRAM are used as the output impedance Ron, the read flag signal is a high level signal and the target code is the first code Zqcode_Ron<N:0>. At this time, the target code received by the pre-drive module 200 is the first code Zqcode_Ron<N:0>. The pre-drive module 200 outputs the drive control signal DRVm<N:0> by combining ODT_info, READ_info, and first code Zqcode_Ron<N:0>; where m determines that there are m 240 Ohms resistors connected in parallel; <N:0> is from the first code Zqcode_Ron<N:0>; DRVm<N:0> is used for reducing the resistance value of each 240 Ohms resistor. For example, when m is 7, the pull-up resistors at the side of the DRAM is used as the output impedance Ron; m in DRVm<N:0> may enable the output impedance Ron of the DRAM to be consisted of 7 first pull-up transistors 110 connected in parallel. <N:0> in DRVm<N:0> may enable the equivalent output impedance Ron to be equal to 31 Ohms (the equivalent resistor of each first pull-up transistor 110 is 216 Ohms), which still meets the impedance matching requirements in a certain range, while the drive capability at the side of the DRAM is improved, thereby improving the quality and integrality of signal transmission.

When the DRAM is in the data writing state, i.e., the pull-up resistors at the side of the DRAM are used as the terminal resistor Rtt, the read flag signal is a low level signal and the target code is the second code Zqcode Rtt<N:0>. At this time, the target code received by the pre-drive module 200 is the second code Zqcode_Rtt<N:0>. The pre-drive module 200 outputs the drive control signal DRVm<N:0> by combining ODT_info, READ_info, and the second code Zqcode_Rtt<N:0>; where m determines that there are m 240 Ohms resistors connected in parallel; <N:0> is from the second code Zqcode_Rtt<N:0>. For example, when m is 1, the pull-up resistors at the side of the DRAM are used as the terminal resistor Rtt; m in DRVm<N:0> may enable the terminal resistor Rtt of the DRAM to be consisted of one first pull-up transistor 110. <N:0> in DRVm<N:0> may enable the equivalent terminal resistor Rtt to be equal to 264 Ohms (the equivalent resistor of each first pull-up transistor 110 is 264 Ohms), which still meets the impedance matching requirements in a certain range, while the quality and integrality of the signal received at the side of the DRAM is improved.

Figure 7:
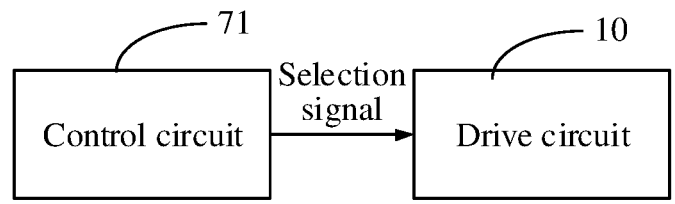
FIG. 7 is a schematic diagram of a memory provided by some embodiments of the present application.

With reference to FIG. 7, embodiments of the present application further provides a memory 70, including the drive circuit 10 as described in various embodiments as described above. The selection signal in the drive circuit 10 is from a control circuit 71 inside the memory 70. When the memory 70 is in the data reading state, the memory 70 outputs data, and thus the drive circuit 10 selects to receive the pre-output signal inside the memory 70 as its own input signal according to a read enable signal from the control circuit 71. When the memory 70 is in the data writing state, the memory 70 receives data, and thus the drive circuit 10 selects to receive the pre-input signal outside the memory 70 as its own input signal according to the write enable signal from the control circuit 71. The pre-output signal and the pre-input signal are both drive control signals.

Those skilled in the art would easily conceive other implementations of the present application after considering the description and practicing the application disclosed herein. The present application is intended to cover any variations, usages, or adaptations of the present application, and these variations, usages, or adaptations follow a general principle of the present application and include the common knowledge or customary technical means in this technical field that are not disclosed in the present application. The description and embodiments are merely considered as exemplary, and the true scope and spirits of the present application are pointed out in the following claims.

It should be understood that the present application is not limited to the accurate structures described and shown in the accompanying drawings above, and various modifications and changes may be made without departing from its scope. Therefore, the scope of the present application shall only be limited by the appended claims.

The invention claimed is:

1. A drive circuit, applied to a Dynamic Random Access Memory (DRAM) and comprising:
   M drive units, having pull-up resistors being adjustable;
   a pre-drive module, connected to the M drive units and configured to control the pull-up resistors of the M drive units and resistance values of the pull-up resistors through a drive control signal, the M being an integer greater than 1; and
   a resistance value selection circuit, connected to the pre-drive module and configured to select, according to a selection signal, one of a first code or a second code for outputting as a target code,
   wherein the pre-drive module is further configured to output the drive control signal according to the target code,
   wherein the DRAM is in a data reading state in response to the selection signal being a high level signal, and the first code is output as the target code,
   wherein the DRAM is in a data writing state in response to the selection signal being a low level signal, and the second code is output as the target code, and
   wherein the first code is configured to set a pull-up resistor of each of the M drive units to have a resistance value less than a first preset resistance value, and the second code is configured to set the pull-up resistor of each of the M drive units to have a resistance value greater than a second preset resistance value.

2. The drive circuit of claim 1, wherein when the resistance value selection circuit outputs the first code, the resistance value of the pull-up resistor of each of the M drive units is less than a resistance value of a third resistor, wherein the resistance value of the third resistor is the first preset resistance value; and
   wherein when the resistance value selection circuit outputs the second code, the resistance value of the pull-up resistor of each of the M drive units is greater than the resistance value of the third resistor, wherein the resistance value of the third resistor is the second preset resistance value.

3. The drive circuit of claim 1, wherein each of the M drive units comprises a first pull-up transistor and a first pull-down transistor;
   wherein first ends of first pull-up transistors in the M drive units are connected to a power terminal, and second ends of the first pull-up transistors in the M drive units are connected to an input/output terminal;
   wherein first ends of first pull-down transistors in the M drive units are connected to the input/output terminal, and second ends of the first pull-down transistors of the M drive units are connected to a ground terminal.

4. The drive circuit of claim 3, wherein the first pull-up transistor of each of the M drive units consists of N first transistors, first ends of the N first transistors being connected to the power terminal, and second ends of the N first transistors being connected to the input/output terminal, and wherein the first pull-down transistor of each of the M drive units consists of N second transistors, first ends of the N second transistors being connected to the input/output terminal, and second ends of the N second transistors being connected to the ground terminal; the N being an integer greater than 1.

5. The drive circuit of claim 4, wherein there are M groups of drive control signals, each group of the M groups of drive control signals having N bits; wherein the M groups of drive control signals have a one-to-one correspondence with the M drive units, and the N bits of each group of the M groups of drive control signals have a one-to-one correspondence with the N first transistors, each bit of the M groups of drive control signals being connected to a control terminal of a corresponding first transistor of the N first transistors.

6. The drive circuit of claim 5, wherein the N first transistors are P-type transistors, and the N second transistors are N-type transistors.

7. The drive circuit of claim 5, wherein the N first transistors and the N second transistors are both N-type transistors.

8. The drive circuit of claim 1, wherein the selection signal is a read flag signal; when the read flag signal is at a high level, the target code is the first code; and when the read flag signal is at a low level, the target code is the second code.

9. The drive circuit of claim 1, wherein the resistance value selection circuit further comprises a calibration circuit, configured to generate the first code and the second code.

10. The drive circuit of claim 9, wherein the calibration circuit comprises:
a comparator, having a first input terminal connected to a reference voltage and a second input terminal connected to a calibration port;
a counter, connected to an output terminal of the comparator and configured to output the first code or the second code;
a pull-up module, having a first end connected to a power terminal, a second end connected to the calibration port, and a third end connected to the counter, wherein an equivalent resistance value of the pull-up module from the power terminal to the calibration port is controlled by the first code or the second code output by the counter; and
an external calibration resistor, having a first end connected to the calibration port, and a second end connected to a ground terminal.

11. The drive circuit of claim 10, wherein the pull-up module and the pull-up resistors of the M drive units have a same circuit structure.

12. The drive circuit of claim 10, wherein the reference voltage is a first reference voltage or a second reference voltage, the first reference voltage being less than the second reference voltage.

13. The drive circuit of claim 10, wherein the reference voltage is a first reference voltage or a second reference voltage, the first reference voltage being less than half of a voltage at the power terminal, and the second reference voltage being greater than half of the voltage at the power terminal.

14. The drive circuit of claim 13, wherein the first reference voltage equals to $VDDQ*(RZQ-b)/(2*RZQ-b)$, and the second reference voltage equals to $VDDQ*(RZQ+a)/(2*RZQ+a)$, wherein VDDQ is the voltage at the power terminal, RZQ is a resistance value of the external calibration resistor, and wherein a and b are both preset deviation values.

15. A memory, comprising:
the drive circuit of claim 1, and
a control circuit,
wherein the selection signal is from the control circuit inside the memory;
wherein the drive circuit selects to receive a pre-output signal inside the memory as an input signal of the drive circuit according to a read enable signal from the control circuit, or the drive circuit selects to receive a pre-input signal outside the memory as the input signal of the drive circuit according to a write enable signal from the control circuit.

* * * * *